United States Patent [19]

Close

[11] 3,800,226

[45] Mar. 26, 1974

[54] MULTIPLE FREQUENCY FM DETECTOR

[75] Inventor: Ernest Frederick Close, Fort Wayne, Ind.

[73] Assignee: The Magnavox Company, Ft. Wayne, Ind.

[22] Filed: Jan. 7, 1971

[21] Appl. No.: 104,686

[52] U.S. Cl. .................. 325/315, 325/349, 329/122

[51] Int. Cl. .................................... H03d 3/24

[58] Field of Search .......... 325/315, 316, 317, 349, 325/432, 435, 443, 452, 455, 457, 458, 460, 462, 464, 465, 468, 392, 487, 470; 329/2, 111, 120, 121, 135, 138, 139; 334/30, 31, 32

[56] References Cited

UNITED STATES PATENTS

| | | | |
|---|---|---|---|
| 2,258,599 | 10/1941 | Carlson | 325/317 |
| 3,217,263 | 11/1965 | Starrevelo et al. | 325/349 |
| 3,526,838 | 9/1970 | Banick | 325/455 |
| 2,445,621 | 7/1948 | Lange | 325/487 |
| 2,354,959 | 8/1944 | McCoy | 325/487 |
| 2,413,977 | 1/1947 | Koch | 329/138 |

OTHER PUBLICATIONS

"FM Limiters and Detectors," John F. Rider Publisher Inc. pp. 33–42, 1955.

*Primary Examiner*—Benedict V. Safourek
*Attorney, Agent, or Firm*—T. A. Briody; W. W. Holloway; R. T. Seeger

[57] ABSTRACT

In an AM-FM receiver an improved FM detector of the quadrature type is disclosed which has a plurality of phase-shifting resonant circuits allowing the FM detector to function as a frequency to voltage converter of the AM intermediate frequency signal as well as the FM intermediate frequency signal. This allows the easy implementation of all electronic tuning on either band as well as the provision of a zero-center meter to indicate the precision of manual station selection.

11 Claims, 3 Drawing Figures

INVENTOR
ERNEST FREDERICK CLOSE
BY Jeffers and Rickert
ATTORNEYS

INVENTOR
ERNEST FREDERICK CLOSE
BY Jeffers and Rickert
ATTORNEYS

INVENTOR
ERNEST FREDERICK CLOSE
BY Jeffers and Rickert
ATTORNEYS

MULTIPLE FREQUENCY FM DETECTOR

CROSS REFERENCE TO RELATED APPLICATIONS

The present invention may be advantageously utilized to effect electronic search tuning for either the AM or the FM band and finds particular utility in applicant's copending application entitled "ELECTRONIC SEARCH TUNING SYSTEM," Ser. No. 104,691 filed Jan. 7, 1971 now U.S. Pat No. 3,714,580 and assigned to the assignee of the present invention. The electronic search tuning scheme disclosed in that application requires a voltage proportional to frequency which is readily available for the FM band, but is not normally available for the AM band. A second frequency to voltage converter could be provided for the AM band in the aforementioned copending application, however, the present invention obviates the need for this second converter.

BACKGROUND OF THE INVENTION

There are, of course, innumerable schemes for converting frequency migrations into changes in voltage output, most of which find their primary application in FM detector circuits. Common among these is the well known Foster-Seeley discriminator circuit and the ratio detector circuit. A new class of detectors known generally as quadrature-type detectors are also available in several forms including the gated beam tube and integrated circuit modules. The present invention relates strictly to this last class of frequency to voltage converters. The prior art FM detectors are limited to one intermediate frequency; however, it will become clear in light of the aforementioned copending application as well as the following discussion that this single frequency limitation may be a highly undesirable feature.

SUMMARY OF THE INVENTION

The present invention discloses a quadrature-type FM detector in an AM-FM heterodyne type receiver which is adapted to convert frequency migrations into voltage changes for a plurality of intermediate frequency inputs.

Quadrature-type FM detectors require two signals 90° out of phase at the intermediate frequency and use these two signals to perform an "and" type gating function to create the output signal. The 90° phase difference between the two signals is normally created by a tank circuit resonant at the intermediate frequency. The present invention provides a plurality of pairs of signals 90° out of phase at a plurality of different intermediate frequencies by providing a series of tank circuits each resonant at a different intermediate frequency. The present invention, of course, obviates the need for several frequency to voltage converters in environments such as that set forth in the aforementioned copending application.

Accordingly, it is one object of the present invention to provide a voltage proportional to frequency at any of several intermediate frequencies.

It is another object of the present invention to meet the above object without the necessity of changing any connections to the detector when switching from one intermediate frequency to another.

It is a further object of the present invention to reduce the cost of an electronic search tuning system in a AM-FM receiver.

A still further object of the present invention is to economically provide a zero-center tuning meter operational on all bands of the receiver.

Yet another object of the present invention is to utilize an FM detector circuit to provide an additional function thus reducing over-all cost of the receiving device.

These and other objects and advantages of the present invention will appear more clearly from the following detailed disclosure read in conjunction with the accompanying drawings.

DESCRIPTION OF THE PREFERRED EMBODIMENT

Figure 1:
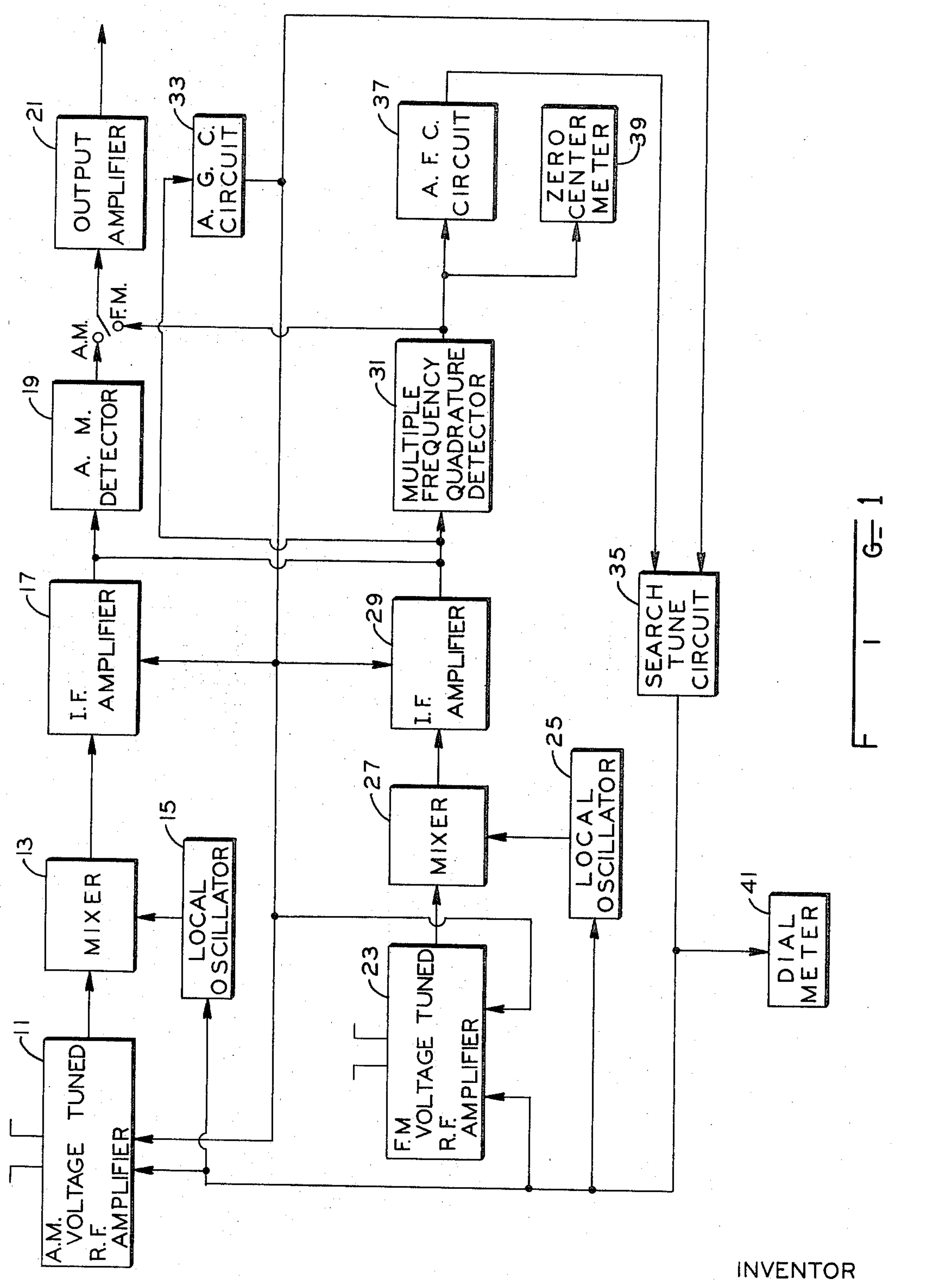
FIG. 1 is a block diagram of a somewhat generalized AM-FM heterodyne receiving device employing the present invention.

Turning first to the block diagram of a heterodyne-type receiving device shown in FIG. 1, an AM portion is shown consisting of an AM voltage tuned radio frequency amplifier 11, a mixer 13 which converts the incoming radio frequency signal to an intermediate frequency by heterodyning the incoming signal against a signal generated by a local oscillator 15, and an intermediate frequency amplifier 17. The intermediate frequency amplifier 17 may, of course, be tuned to the standard 455 kilocycle intermediate frequency. This intermediate frequency amplifier in turn supplies its output signal to an AM detector circuit 19 which in turn drives an output amplifier 21 all in well-known fashion.

Also orthodox in its form is an FM receiver portion consisting of an FM voltage tuned radio frequency amplifier 23 the output of which is again beat against a local oscillator signal generated by the local oscillator 25 in a mixer 27. This resultant intermediate frequency signal, typically 10.7 megacycles, is fed to an intermediate frequency amplifier 29 which in turn supplies the 10.7 megacycle signal to a detector 31. Some FM receivers of course have more than one IF stage of perhaps differing IF frequencies. This detector 31 not only performs its normal function of supplying the audio frequency signal to a common output amplifier 21, but also supplies a number of additional functions foreign to the standard FM detector circuit. Two possible embodiments of this detector 31 are illustrated in FIGS. 2 and 3 respectively, and will be discussed in detail in the sequel.

While several of the blocks thus far discussed might in practice be eliminated or have their function performed by other portions of the circuitry, such component sharing has not been discussed because it has no bearing on the present invention. The output amplifier 21 supplies an audio output signal. An automatic gain control circuit 33 in well known fashion feeds back a voltage to adjust the gain of both RF amplifiers and both intermediate frequency amplifiers. This automatic gain circuit also supplies a signal to a search tune circuit 35, the nature and function of which has been discussed in detail in the aforementioned copending application.

Unorthodox in its presence is the line leading from the AM intermediate frequency amplifier 17 to the multiple frequency quadrature detector 31. The detector 31 is adapted to be effective both at the AM intermediate frequency and at the FM intermediate frequency so that this detector provides a signal to the automatic frequency control circuit which, as is more clearly pointed out in the aforementioned copending application, is utilized in the search tuning process. A zero-center or tuning meter 39 is also provided responsive to the output of the detector 31 and hence the meter indicates both AM and FM tuning. A meter 41 is also provided which substitutes for the well known dial in manually-tuned receivers.

Figure 2:
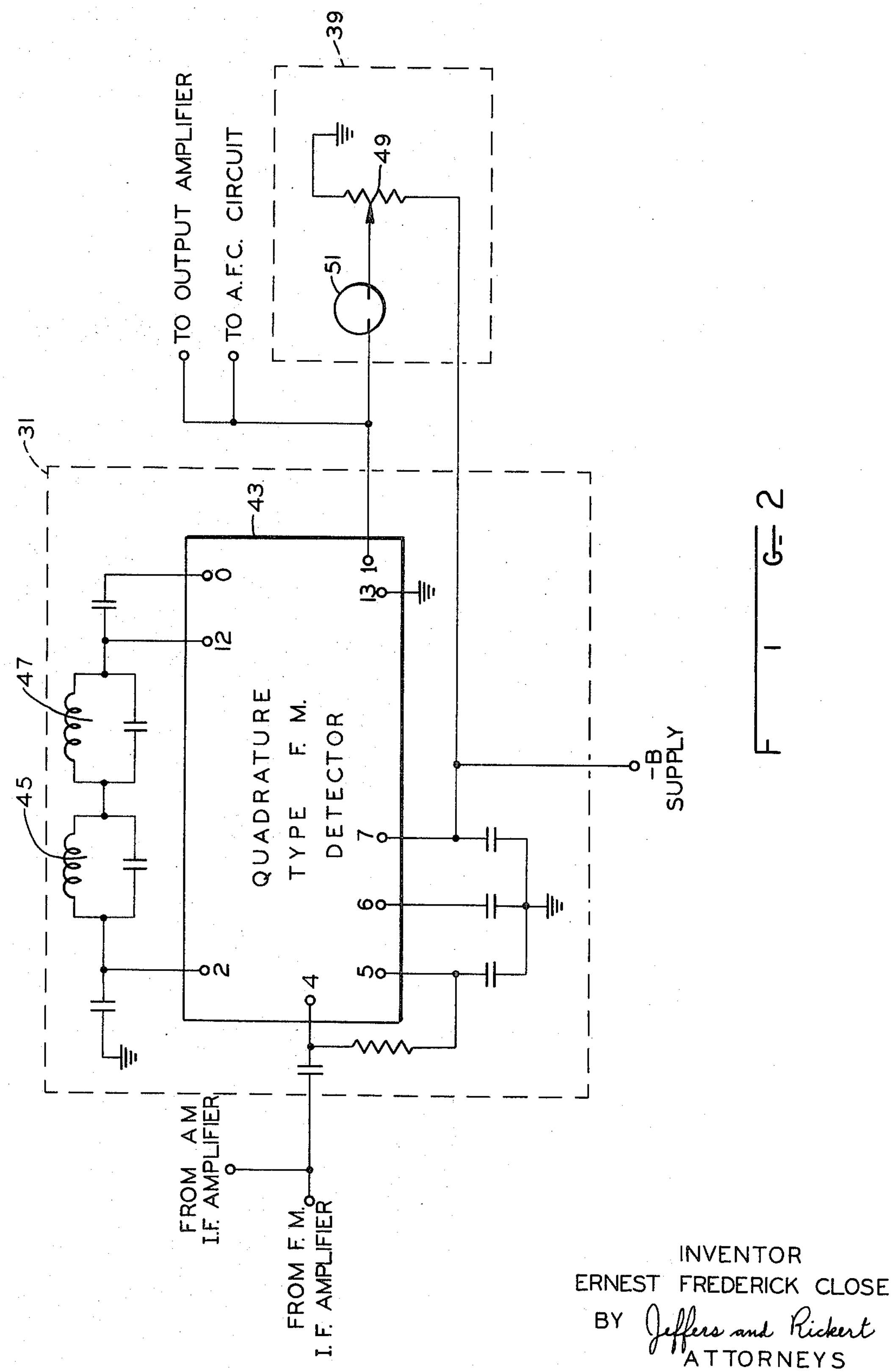
FIG. 2 is a partial schematic diagram of one embodiment of the multiple frequency quadrature detector of FIG. 1 employing an integrated circuit module.
Figure 3:
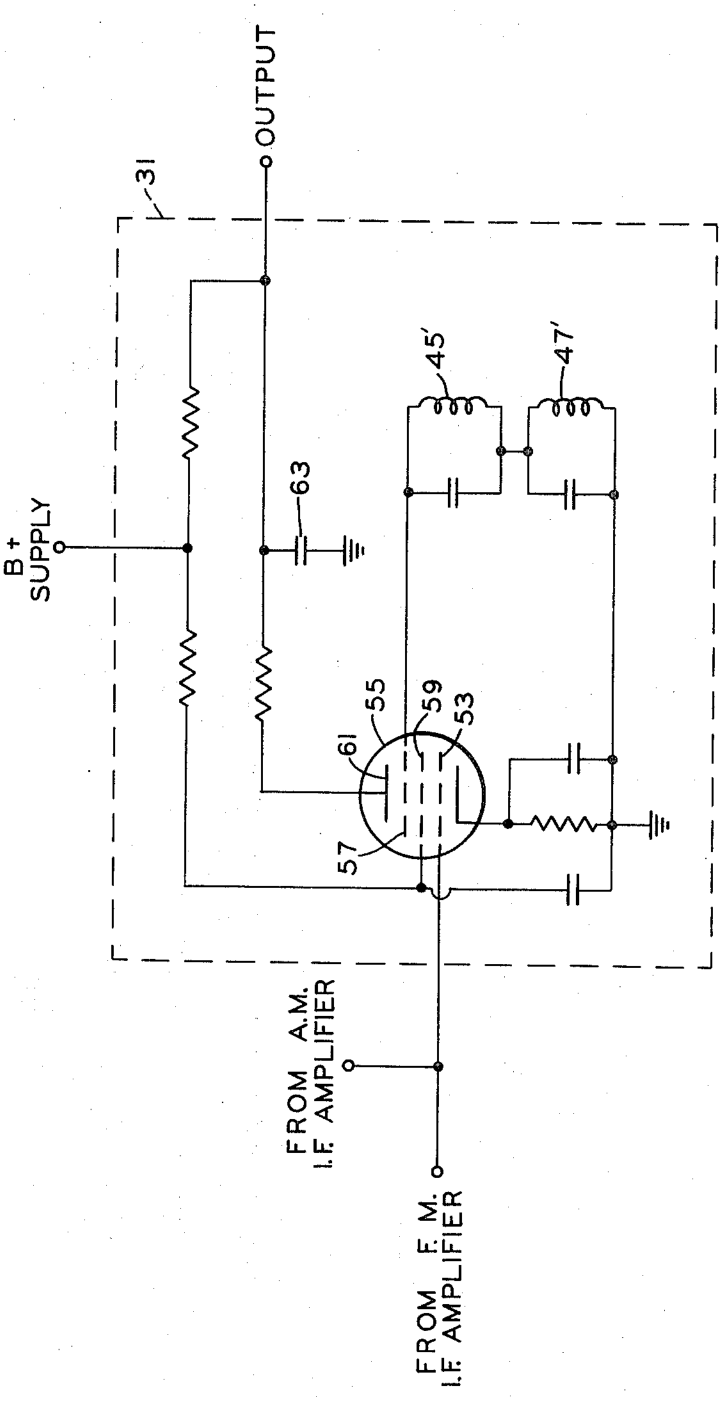
FIG. 3 is a schematic diagram of another multiple frequency quadrature detector according to the teachings of the present invention using a gated beam tube.

Turning now to FIG. 2, the zero-center meter 39 and the multiple frequency quadrature detector 31 are illustrated in considerably more detail. The detector 31 is built around an integrated circuit which as illustrated is a Sprague ULN 2111A module. Other manufacturers supply modules which differ internally but which will function well in this application. This integrated circuit module 43 has a plurality of numbered terminals most of which are not germane to the present invention. The integrated circuit 43 has an input terminal 4 which is connected to both the AM and FM intermediate frequency amplifiers and has an output terminal 1 which supplies the voltage variations to the output amplifier 21, the automatic frequency control circuit 37 and the zero-center meter 39. This integrated circuit also has a pair of terminals 2 and 12 across which in its normal use a single tuned LC circuit having a resonant frequency equal to the frequency of the incoming signal is connected. As illustrated in FIG. 2, a tuned circuit 45 resonant, for example, at the 455 kilocycle AM intermediate frequency is connected in series with a second tuned circuit 47 resonant, for example, at the 10.7 megacycle FM intermediate frequency across the quadrature terminals 2 and 12. The effect of these two tuned circuits across the terminals 2 and 12 is to provide the desired 90° phase difference at each of the intermediate frequencies rather than at but a single intermediate frequency as the integrated circuit was intended to function. The nature of the quadrature terminals 2 and 12 and their intended function will appear more clearly when the somewhat more classical detector of FIG. 3 is discussed.

The zero-center meter 39 is seen in FIG. 2 to consist of a manually adjustable potentiometer 49 which may be used to center the meter indication under a no-signal condition and a classical D'Arsonval moving coil meter 51. The integrated circuit 43 will provide an output of voltage as a function of input frequency which is basically the well known S curve except that two S's will appear in this curve, one centered at the AM intermediate frequency, the other centered at the FM intermediate frequency. As is well known, these S curves have a no signal direct current output voltage which could be zero in some embodiments, however, in the embodiment of FIG. 2, it is a positive 4 volt direct current level. There is also a no signal voltage crossover at precisely the center frequency and hence the zero-center meter 39 may be calibrated precisely at either one of the two intermediate frequencies or under a no-input condition. Such calibration is effected by moving the potentiometer 49 until a zero reading is achieved.

Turning now to FIG. 3, a multiple frequency quadrature detector of the gated beam tube type is illustrated in even greater detail. The inputs from both the AM and FM intermediate frequency amplifiers are supplied to a limiter grid 53 of a type 6BN6 or other gated beam tube. As is well known in the FM limiter and detector art, this grid 53 performs the function of limiting the amplitude of incoming signals to a fixed value, thus disposing of variations in amplitude. The gated beam tube 55 also has a quadrature grid 57 and an accelerator screen 59. The tube functions as a switching device allowing a current flow from cathode to the plate 61 when both limiter and quadrature grids are positive. A frequency modulated signal applied to the limiter grid produces a signal on the quadrature grid which is the center frequency of the applied FM signal and is due to resonance in one of the two tuned circuits 45' or 47' which resonance is induced by electron flow within the tube. The signal on the quadrature grid appears and disappears at the center intermediate frequency 90° out of phase with the original signals applied to the limiter grid. Thus, the limiter grid gating function is the familiar accordion-like square wave containing FM information while the gating signal to the quadrature grid has no FM component and is 90° removed from the limiter grid signal. With no incoming frequency modulation, these two grid signals overlay an amount of 90°. If the incoming signal is frequency modulated, the limiter grid signal will be shifted somewhat so that the two grid signals shift in relative phase so plate current pulses of varying width flow. Greater frequency modulation causes these pulses to vary more in width. These varying plate current pulses are integrated by the capacitor 63 to provide an output voltage indicative of input frequency. Suppose again that the tuned circuit 47' is resonant at a 10.7 megacycle FM intermediate frequency while the tuned circuit 45' is resonant at a 455 kilocycle AM intermediate frequency. Under these circumstances, if only the FM input is present to the detector 31, only the tank circuit 47' will resonate and the detector will function as an FM detector circuit. On the contrary, if only an AM signal is present, only the tuned circuit 45' will resonate, and the detector will function to provide an output voltage indicative of frequency deviations in the incoming AM signal.

Numerous modifications will suggest themselves to those of ordinary skill in the art, thus, for example, while only two tuned circuits have been illustrated, it should be clear that three or more tuned circuits could be provided so that the detector would function for three or more incoming signals. Similarly, only one specific quadrature-type detector has been discussed in detail whereas virtually any other quadrature-type detector could be modified in accordance with the present teachings. Accordingly, the scope of the present invention is to be measured only by that of the appended claims.

I claim:

1. In an AM-FM heterodyne receiving device having a quadrature-type FM detector circuit with phase-shift connections, the improvement comprising:

a first circuit resonant at one of the FM intermediate frequencies;

a second circuit resonant at the AM intermediate frequency, said first and second circuits being connected in series across said FM detector phase-shift connections; and means for selectively supplying one of the AM and FM intermediate frequency signals to said FM detector whereby a voltage proportional to frequency variations from the corresponding intermediate frequency may be provided for both AM and FM operation.

2. The improvement of claim 1 further comprising a search tune circuit and means interconnecting the search tune circuit and said FM detector.

3. The improvement of claim 1 further comprising a zero-center meter coupled to said FM detector and adapted to indicate a less than optimum receiver tuning condition when said meter reads other than zero.

4. The improvement of claim 3 further comprising a variable resistance in circuit with said meter for manually calibrating said meter.

5. In a receiving device, the method of selectively providing and utilizing a voltage which is proportional to frequency at more than one frequency comprising:

providing the phase-shift circuit of a quadrature-type FM detector with a series combination of a plurality of parallel resonant circuits, each resonant at a different frequency;

selectively providing sources of at least two distinct intermediate frequencies to the detector, there being at least one circuit resonant at each said intermediate frequency; and utilizing the output of said detector to tune the receiving device.

6. The method of claim 5 wherein the step of utilizing comprises supplying said output to a search tune circuit, said search tune circuit effective to supply varying voltages to a voltage tuned radio frequency amplifier.

7. The method of claim 5 wherein the step of utilizing comprises supplying said output signal to a zero-center meter whereby the receiving device may be manually tuned in accordance with the meter indication.

8. A frequency to voltage converter comprising:

a quadrature-type FM detector having output circuit means and phase-shift terminal means for connecting the detector to a phase-shift circuit;

means for selectively applying one of two distinct intermediate frequency signals to said detector, one of the said signals being frequency modulated and the other of said signals being amplitude modulated;

a pair of resonant circuits, each comprising a parallel combination of an inductance and a capacitance and each resonant at a distinct one of said intermediate frequencies; and means simultaneously connecting both said resonant circuits in series to said phase-shift terminal means whereby said detector is operable at more than one of said distinct intermediate frequencies.

9. A multiple band heterodyne receiving device having at least two distinct intermediate frequency channels, a frequency detector circuit for providing an output voltage proportional to the frequency of an input signal and responsive to more than one range of frequencies, said frequency detector circuit comprising a quadrature type FM detector circuit with phase shift connections having at least two circuits resonant at at least two said intermediate frequencies connected in series therebetween; and means coupling at least two such intermediate frequency channels to said frequency detector circuit to thereby provide a voltage proportional to frequency for more than one frequency band.

10. The device of claim 9 further comprising a search tune circuit having a voltage input terminal connected to the frequency detector circuit.

11. The device of claim 9 further comprising a zero center meter coupled to the frequency detector circuit and adapted to indicate a less than optimum receiver tuning condition when the meter reads other than zero.

* * * * *